(12) United States Patent
Watanabe et al.

(10) Patent No.: US 8,304,901 B2
(45) Date of Patent: Nov. 6, 2012

(54) SEMICONDUCTOR DEVICE HAVING A GROOVE AND A JUNCTION TERMINATION EXTENSION LAYER SURROUNDING A GUARD RING LAYER

(75) Inventors: Hiroshi Watanabe, Tokyo (JP); Naoki Yutani, Tokyo (JP); Kenichi Ohtsuka, Tokyo (JP); Kenichi Kuroda, Tokyo (JP); Masayuki Imaizumi, Tokyo (JP); Yoshinori Matsuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 85 days.

(21) Appl. No.: 12/867,283

(22) PCT Filed: Mar. 12, 2009

(86) PCT No.: PCT/JP2009/054726
§ 371 (c)(1),
(2), (4) Date: Aug. 12, 2010

(87) PCT Pub. No.: WO2009/116444

PCT Pub. Date: Sep. 24, 2009

(65) Prior Publication Data
US 2011/0001209 A1      Jan. 6, 2011

(30) Foreign Application Priority Data

Mar. 17, 2008   (JP) .................. 2008-067095

(51) Int. Cl.
*H01L 23/48* (2006.01)
(52) U.S. Cl. ......... 257/734; 257/735; 257/738; 257/762
(58) Field of Classification Search .................. 257/734, 257/735, 738, 762, E23.02
See application file for complete search history.

(56) References Cited

U.S. PATENT DOCUMENTS 5,914,500 A      6/1999 Bakowski et al.
(Continued)

FOREIGN PATENT DOCUMENTS

DE          103 12 911 A1    10/2004
(Continued)

OTHER PUBLICATIONS

Extended Search Report issued Aug. 17, 2011 in Europe Application No. 09723343.1.

(Continued)

*Primary Examiner* — Howard Weiss
*Assistant Examiner* — Steven Rao
(74) *Attorney, Agent, or Firm* — Oblon, Spivak, McClelland, Maier & Neustadt, L.L.P.

(57) ABSTRACT

In a termination structure in which a JTE layer is provided, a level or defect existing at an interface between a semiconductor layer and an insulating film, or a minute amount of adventitious impurities that infiltrate into the semiconductor interface from the insulating film or from an outside through the insulating film becomes a source or a breakdown point of a leakage current, which deteriorates a breakdown voltage. A semiconductor device includes: an $n^-$ type semiconductor layer formed on an $n^+$ type semiconductor substrate; a first electrode that is formed on the $n^-$ type semiconductor layer and functions as a Schottky electrode; a GR layer that is a first p type semiconductor layer formed on a surface of the $n^-$ type semiconductor layer below an end of the first electrode and a perimeter thereof; a JTE layer that is formed of a second p type semiconductor layer formed on a bottom and a lateral surface of a groove arranged in a ring shape around the GR layer apart from the GR layer, in a surface of the $n^-$ type semiconductor layer; an insulating film provided so as to cover the GR layer and the JTE layer; and a second electrode that is an Ohmic electrode formed below a rear surface of the $n^+$ type semiconductor substrate.

9 Claims, 9 Drawing Sheets

U.S. PATENT DOCUMENTS

| | | |
|---|---|---|
| 6,340,836 B1 | 1/2002 | Shikata |
| 6,831,345 B2 | 12/2004 | Kinoshita et al. |
| 7,394,158 B2 * | 7/2008 | Carta et al. .................... 257/762 |
| 7,781,802 B2 * | 8/2010 | Yamagami et al. ........... 257/199 |
| 2005/0045892 A1 | 3/2005 | Hayashi et al. |
| 2008/0286968 A1 * | 11/2008 | Carta et al. .................... 438/686 |

FOREIGN PATENT DOCUMENTS

| | | |
|---|---|---|
| EP | 0 361 319 A2 | 4/1990 |
| EP | 0 361 319 A3 | 4/1990 |
| JP | 2000 312011 | 11/2000 |
| JP | 2001-94095 | 4/2001 |
| JP | 2001 508950 | 7/2001 |
| JP | 2003 101039 | 4/2003 |
| JP | 2005 135972 | 5/2005 |
| JP | 2005 303025 | 10/2005 |
| JP | 2008 53418 | 3/2008 |
| WO | WO 2006/047382 A2 | 5/2006 |
| WO | WO 2006/047382 A3 | 5/2006 |
| WO | WO 2006/047382 A9 | 5/2006 |

OTHER PUBLICATIONS

Office Action issued Mar. 29, 2012, in Korean Patent Application No. 10-2010-7020870 (with partial English-language translation).

* cited by examiner

F I G . 1
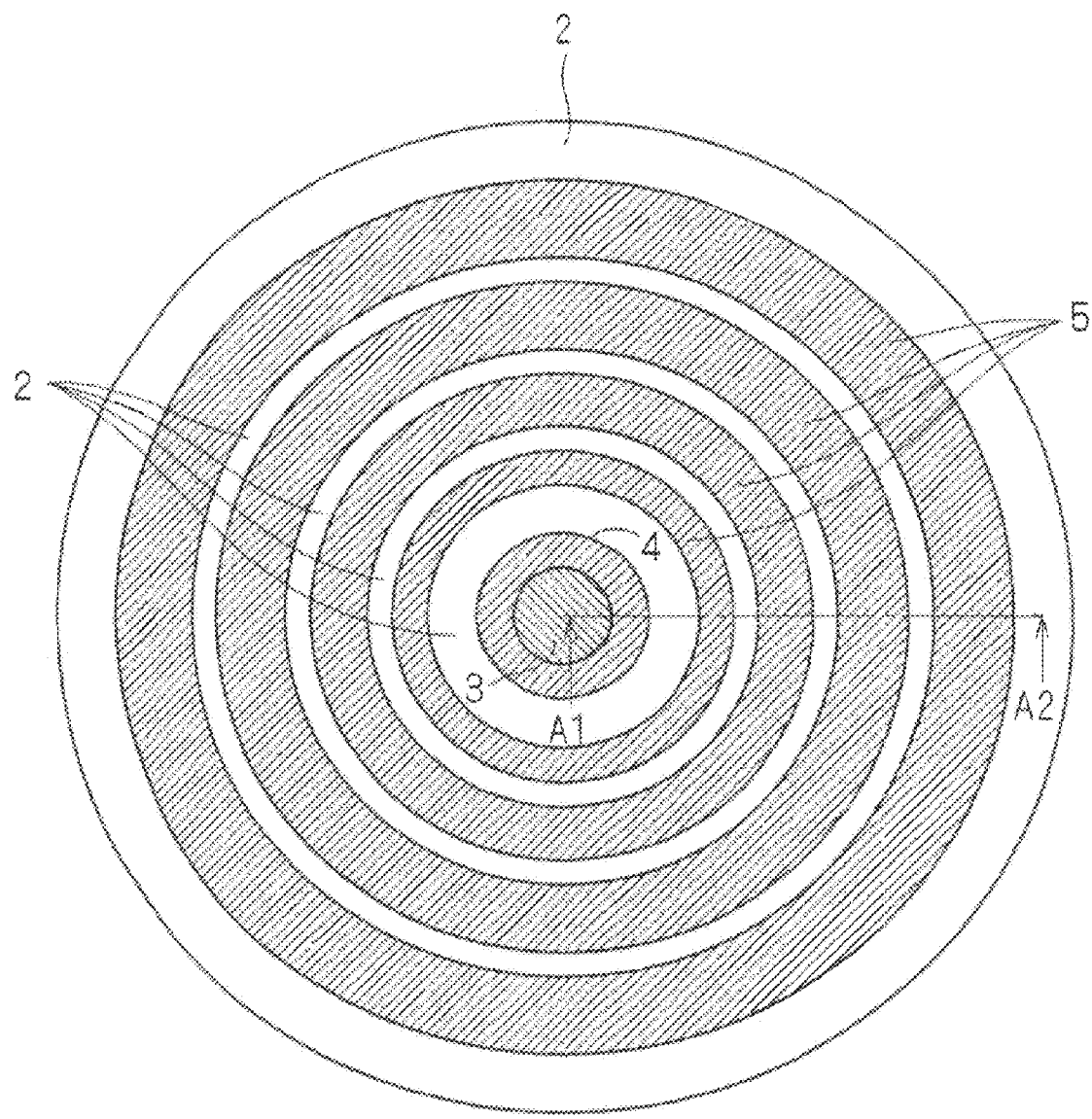

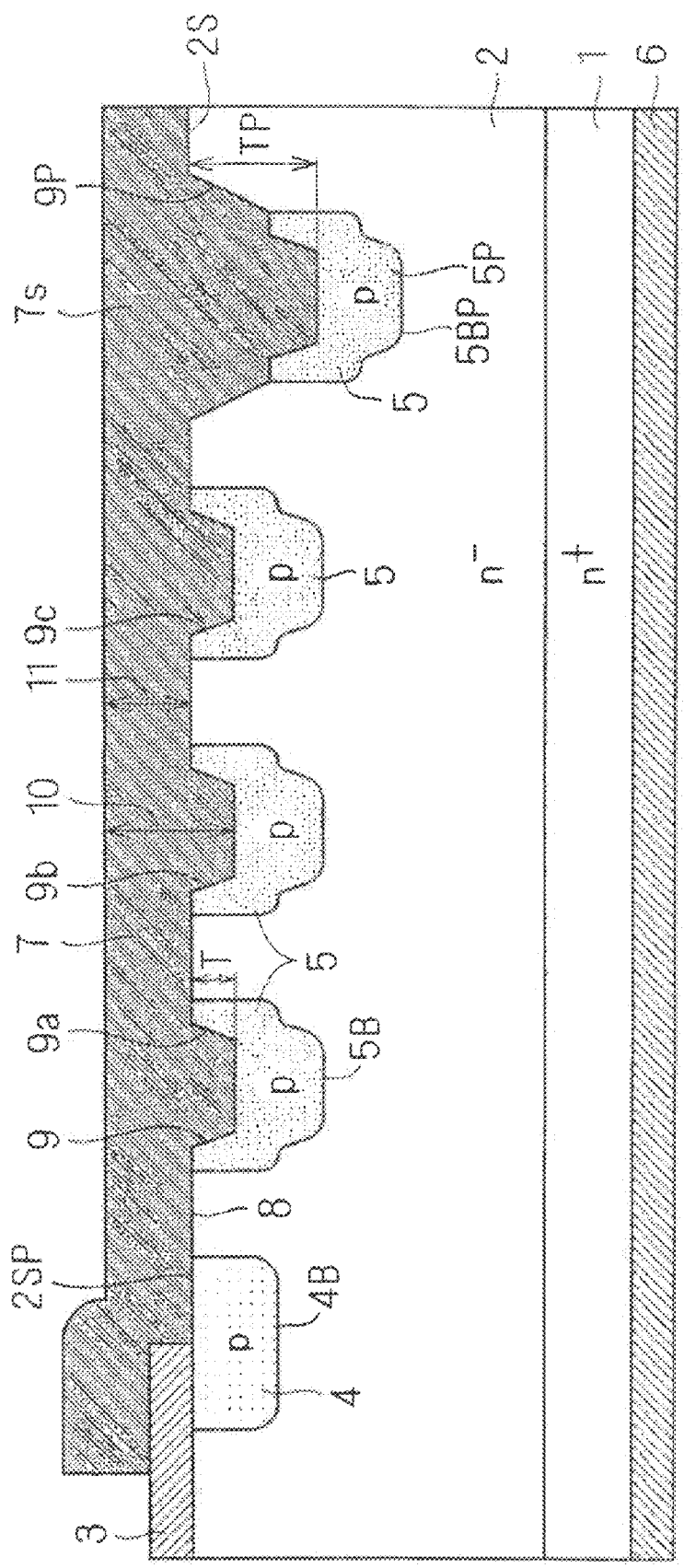
F I G. 5

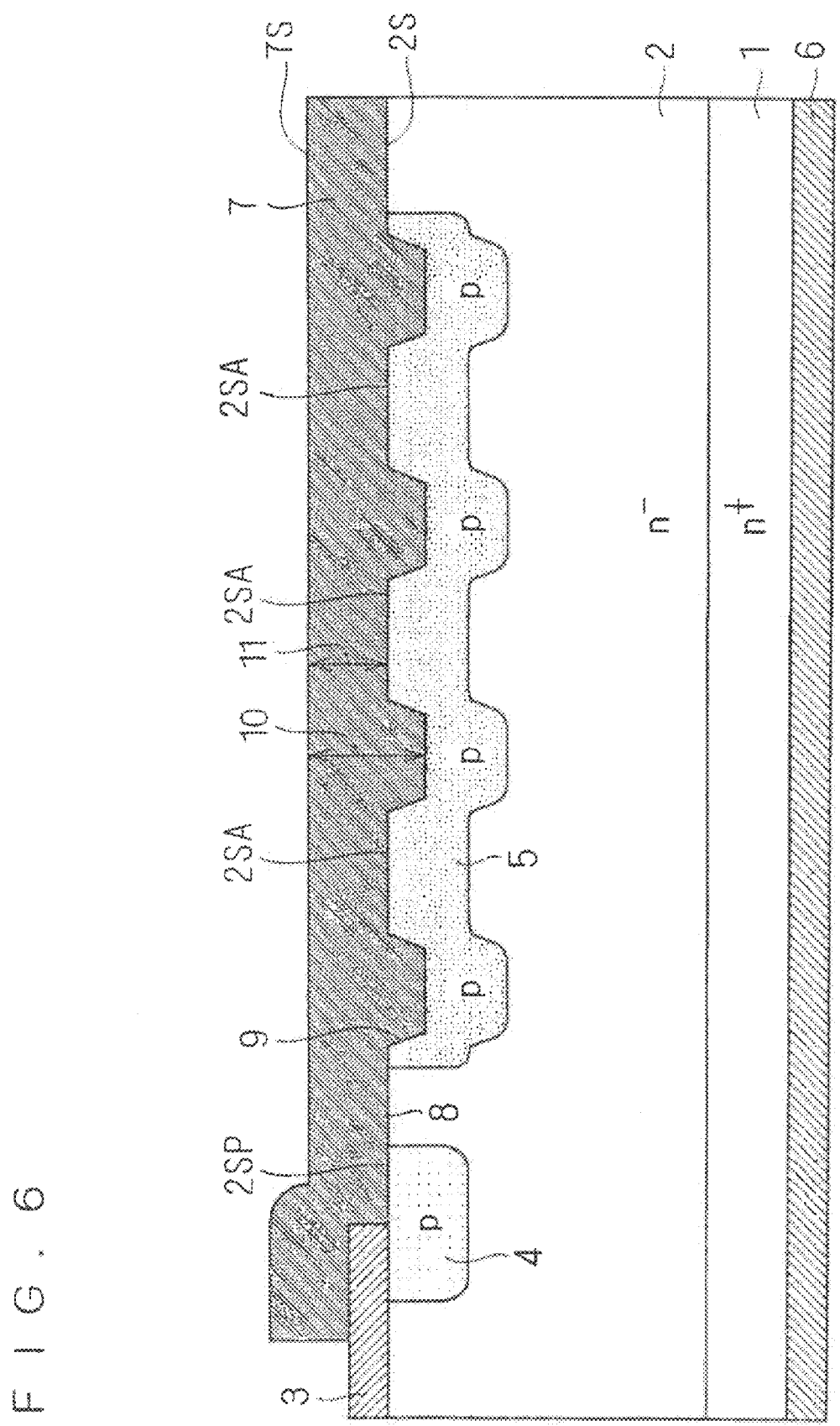
F I G . 6

SEMICONDUCTOR DEVICE HAVING A GROOVE AND A JUNCTION TERMINATION EXTENSION LAYER SURROUNDING A GUARD RING LAYER

TECHNICAL FIELD

The present invention relates to a semiconductor device, and more particularly, to a high-voltage semiconductor device.

BACKGROUND ART

A conventional power device includes a p type semiconductor layer and an n type semiconductor layer formed in a surface of a semiconductor substrate by ion implantation or impurity diffusion, and an insulating film and an electrode formed on surfaces of the p type semiconductor layer and the n type semiconductor layer. At a corner portion (electrode end portion) of the electrode of a power device having the basic configuration as described above, an electric field is easily concentrated. Accordingly, in order to mitigate the electric field concentration, at a position in contact with a termination portion of the electrode, an impurity region (hereinafter, referred to as guard ring (GR) layer) is formed in the semiconductor layer. Further, in order to mitigate the electric field concentration occurring at a corner portion (electrode end portion) of the GR layer by extension toward an inside of the semiconductor layer, another impurity region (hereinafter, referred to as junction termination extension (JTE) layer) is formed in the surface of the semiconductor layer outside the GR layer so as to be in contact with or apart from the GR layer.

FIG. 9 is a vertical cross-sectional view showing the electrode termination structure of the conventional power semiconductor device described in Patent Document 1, and more specifically, shows a vertical cross-sectional structure of a Schottky barrier diode including a GR layer and a plurality of JTE layers as a termination structure. As shown in FIG. 9, a first electrode 3P is formed as a Schottky electrode on a surface of an n⁻ type semiconductor layer 2P on an n⁺ type semiconductor substrate 1P. In addition, a GR layer 4P formed of a first p type semiconductor layer is formed from the surface of the n⁻ type semiconductor layer 2P toward an inside of the layer 2P so as to surround the first electrode 3P in a ring shape while being in contact with an end portion of the first electrode 3P. Moreover, from the surface of the n⁻ type semiconductor layer 2P toward the inside of the layer 2P, a plurality of JTE layers 5P formed of a second p type semiconductor layer are formed so as to be positioned in a ring shape around the GR layer 4 while being apart from the GR layer 4P. A second electrode 6P is formed below a rear surface of the n⁺ type semiconductor substrate 1P as an Ohmic electrode. Further, an insulating film 7P is formed on part of the electrode 3P that includes the end portion of the first electrode 3P, on a surface of a portion of the GR layer 4 that extends from the end portion of the first electrode 3P toward an outside, on surfaces of the respective JTE layers 5P, and on a surface of the n⁻ type semiconductor layer 2P.

As described above, the termination structure of FIG. 9 includes the GR layer 4P for mitigating an electric field at the end portion of the first electrode 3P, and a plurality of JTE layers 5P for mitigating electric field concentration at an end portion (corner portion) 4PE of the GR layer 4P.

The above-mentioned semiconductor device having the termination structure consisting of the GR layer 4P and the JTE layers 5P is capable of obtaining a breakdown voltage that is close to an ideal breakdown voltage calculated from a thickness and impurity concentration of the n⁻ type semiconductor layer 2P.

Patent Document 1: Japanese Patent Application Laid-Open No. 2003-101039

However, in the termination structure in which the JTE layers 5 as shown in FIG. 9 are provided, an energy level or defect existing at an interface 8P between the n⁻ type semiconductor layer 2P and the insulating film 7P, or a minute amount of adventitious impurities that infiltrate from the insulating film 7P through the interface 8P and a minute amount of adventitious impurities that infiltrate into the interface 8P from an outside through the insulating film 7P become a source and a breakdown point of a leakage current. As a result, the breakdown voltage deteriorates significantly in some cases.

DISCLOSURE OF INVENTION

The present invention has been made to solve the above-mentioned problem, and an object thereof is to provide a semiconductor device having a high breakdown-voltage, in which deterioration of the breakdown voltage due to influences of a defect and an energy level existing on the semiconductor layer surface of a first conductivity type and adventitious impurities is suppressed.

According to an aspect of the present invention, a semiconductor device includes: a semiconductor layer of a first conductivity type; an electrode formed on a main surface of the semiconductor layer; a guard ring layer of a second conductivity type formed from a part of the main surface of the semiconductor layer directly below an end portion of the electrode and a perimeter portion of the end portion toward an inside of the semiconductor layer so as to surround the electrode; at least one groove formed from a part of the main surface of the semiconductor layer located outside the end perimeter portion toward the inside of the semiconductor layer so as to surround the guard ring layer apart from the guard ring layer; at least one JTE layer of the second conductivity type formed from a bottom of the at least one groove toward the inside of the semiconductor layer so as to surround the guard ring layer; and an insulating film formed on the main surface of the semiconductor layer so as to cover a surface of the guard ring layer and a surface of the at least one JTE layer.

According to the aspect of the present invention, the JTE layer is formed in a region directly below the bottom of the groove formed in the surface of the first conductivity type semiconductor layer, and thus it is possible to reduce the electric field strength exerted on the surface of the first conductivity type semiconductor layer during application of a reverse voltage. In addition, according to the aspect of the present invention, even when a charged state of the surface of the first conductivity type semiconductor layer changes, the surface of the first conductivity type semiconductor layer in which the groove is not formed is relatively apart from the bottom of the JTE layer, and thus fluctuations in electric field strength distribution at the end portion of the JTE layer can be suppressed.

The object, features, aspects, and advantages of the present invention will be more apparent from the following detailed description in conjunction with the attached drawings.

BRIEF DESCRIPTION OF DRAWINGS

FIG. 1 is a top view schematically showing a semiconductor device according to a first embodiment of the present invention.

FIG. 5 is a vertical cross-sectional view showing a semiconductor device according to a second modification of the first embodiment of the present invention.

FIG. 6 is a vertical cross-sectional view showing a semiconductor device according to a third modification of the first embodiment of the present invention.

BEST MODE FOR CARRYING OUT THE INVENTION

First Embodiment

In the present embodiment, as an example of a semiconductor device according to the present invention, the structure of a Schottky barrier diode and a method of manufacturing the same will be described.

Figure 2:
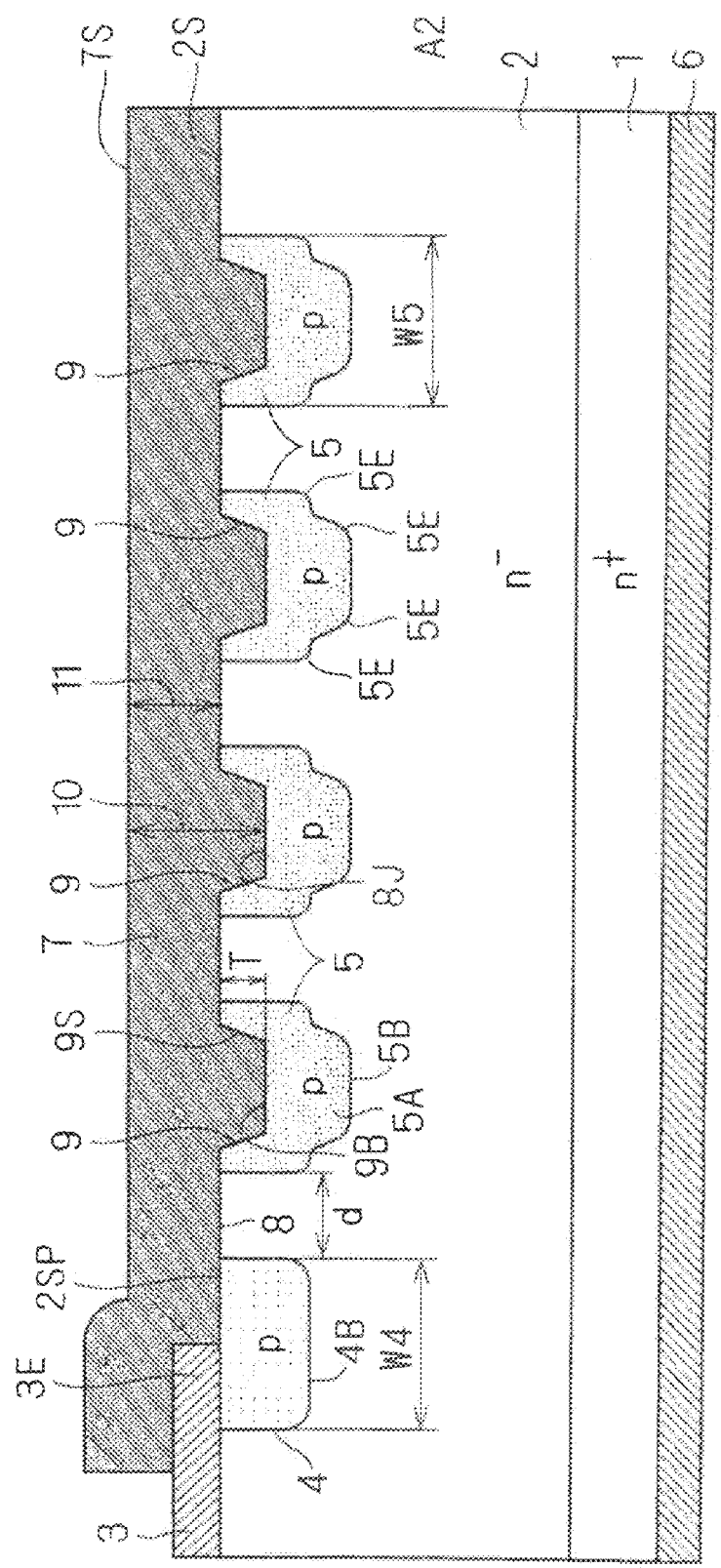
FIG. 2 is a vertical cross-sectional view showing the semiconductor device according to the first embodiment of the present invention.

FIG. 1 is a top view showing the semiconductor device according to the present embodiment. Further, FIG. 2 is a vertical cross-sectional view taken along a line A1-A2 of the top view of FIG. 1. Hereinafter, each cross-sectional view of the semiconductor device described in the present embodiment is assumed to be the vertical cross-sectional view taken along the line A1-A2 of the top view of FIG. 1 of the semiconductor device. Note that for the sake of convenience, an insulating film 7 and grooves 9 disposed correspondingly to respective JTE layers 5, which are shown in FIG. 2, are not shown in FIG. 1.

The termination structure of the Schottky barrier diode shown in FIG. 2 includes: (1) an $n^-$ type semiconductor layer (corresponding to a first conductivity type semiconductor layer) 2 formed on an upper surface of an $n^+$ type semiconductor substrate 1; (2) a first electrode 3 that is formed on a main surface 2S of the $n^-$ type semiconductor layer 2 and functions as a Schottky electrode; (3) a GR layer 4 formed of a first p type (corresponding to a second conductivity type) semiconductor layer that is formed from a portion located directly below an end portion 3E of the first electrode 3 and a portion 2SP located directly below a perimeter portion of the end portion 3E in the main surface 2S of the $n^-$ type semiconductor layer 2 toward an inside of the $n^-$ type semiconductor layer 2 so as to surround the first electrode 3 in a ring shape; (4) a plurality of grooves 9 made in a ring shape from a portion located outside the perimeter portion of the end portion 3E in the main surface 2S of the $n^-$ type semiconductor layer 2 toward the inside of the $n^-$ type semiconductor layer 2 so as to surround a periphery of the GR layer 4 apart from the GR layer 4; (5) a plurality of JTE layers 5 formed of a second p type semiconductor layer that are formed, for each groove 9, in a ring shape from both of a bottom 9B and a lateral surface 9S of the groove 9 toward the inside of the $n^-$ type semiconductor layer 2 so as to surround the GR layer 4; (6) an insulating film 7 provided on an upper surface of the end portion 3E of the first electrode 3 and a part of the main surface 2S of the $n^-$ type semiconductor layer 2 that is positioned outside the end portion 3E so as to cover a surface 2SP of the GR layer 4 and surfaces of the respective JIE layers 5; and (7) a second electrode 6 that is formed on a rear surface of the $n^+$ type semiconductor substrate 1 and functions as an Ohmic electrode.

As shown in the top view of FIG. 1, the GR layer 4 entirely surrounds a periphery of the end portion 3E (FIG. 2) of the first electrode 3, and each of the plurality of ring-shaped JTE layers 5 formed apart from the GR layer 4 entirely surrounds the first electrode 3 and the GR layer 4. Note that the shape of the GR layer 4 is not limited to a ring shape, and may be, for example, a quadrangular shape. What matters is that the GR layer 4 is required to entirely surround the periphery of the end portion of the first electrode 3. Similarly, the shapes of each groove 9 and each JTE layer 5 positioned directly therebelow are not limited to a ring shape taken as an example. What matters is that each groove 9 and each JTE layer 5 positioned directly therebelow are required to have a shape capable of entirely surrounding the first electrode 3 and the GR layer 4. Those hold true for respective modifications described below.

When the surface of the GR layer 4 is in contact with a rear surface of the end portion 3E of the first electrode 3 formed on the main surface 2S of the $n^-$ type semiconductor layer 2, the GR layer 4 functions as a GR for mitigating electric field concentration occurring at the end portion 3E (in particular, corner portion thereof) of the first electrode 3 during application of a reverse voltage.

Each JTE layer 5 is formed directly below the bottom 9B and the lateral surface 9S of the groove 9 corresponding thereto, and is arranged so as to be positioned in a ring shape around a periphery of the GR layer 4 apart from the GR layer 4. A plurality of grooves 9 are formed in the main surface 2S of the $n^-$ type semiconductor layer 2 that is positioned outside the GR layer 4, and the JTE layer 5 is formed in each of the grooves 9. The JTE layers 5 are arranged apart from each other. The JTE layer 5 functions as a JTE for mitigating electric field concentration occurring at the end portion (corner portion) of the GR layer 4 during application of a reverse voltage. Accordingly, in a case where a plurality of JTE layers 5 are formed as shown in FIG. 2, the effect of mitigating an electric field at the end portion of the GR layer 4 increases. Needless to say, even in a case where there are provided one groove 9 and one JTE layer 5 positioned directly therebelow, the effect of mitigating an electric field at the end portion of the GR layer 4 is obtained. Therefore, setting may be made such that there are provided one groove 9 and one JTE layer 5 positioned directly therebelow. This holds true for the respective modifications described below.

One of the characteristics of the present embodiment resides in that the JTE layer 5 is formed also in the portion of the $n^-$ type semiconductor layer 2 positioned directly below the lateral surface 9S of the groove 9. In the case where this characteristic is provided, compared with a case where the JTE layer is not formed in the portion directly below the lateral surface 9S of the groove 9, an area of a JTE layer 5A among a plurality of JTE layers 5 that is adjacent to and opposed to the GR layer 4 increases in vertical cross section. Accordingly, the effect of enabling further mitigation of electric field concentration at the end portion of the GR layer 4 is obtained by extending the electric field distribution applied to the end portion of the GR layer 4 to he uniform. Moreover, the JTE layers 5 corresponding to all grooves 9 are formed also in the portions directly below the lateral surfaces 9S of the respective grooves 9. Therefore, there is also obtained an effect that the electric field concentration occurring at corner portions 5E of the respective JTE layers 5 is also mitigated by extending the electric field distribution in neighboring JTE layers 5.

Further, in the present embodiment, a thickness of the portion of the JTE layer 5 formed directly below the bottom 9B of the groove 9 is set such that the bottom 5B of the portion of the JTE layer 5 that is formed directly below the bottom 9B of the groove 9 is positioned at a deeper position of the bottom 4B of the GR layer 4 when viewed from the main surface 2S. By employing this structure, the bottom 5B of the JTE layer 5 that is located at a deeper position and the perimeter portion thereof attract the electric field around the GR layer 4 toward the bottom 5B side of the JTE layer 5, resulting in the electric field distribution around the GR layer 4 being biased further in an internal direction of the n⁻ type semiconductor layer 2. As a result, there is obtained an effect that the electric field strength is reduced on the main surface 2S of the n⁻ type semiconductor layer 2.

Figure 9:
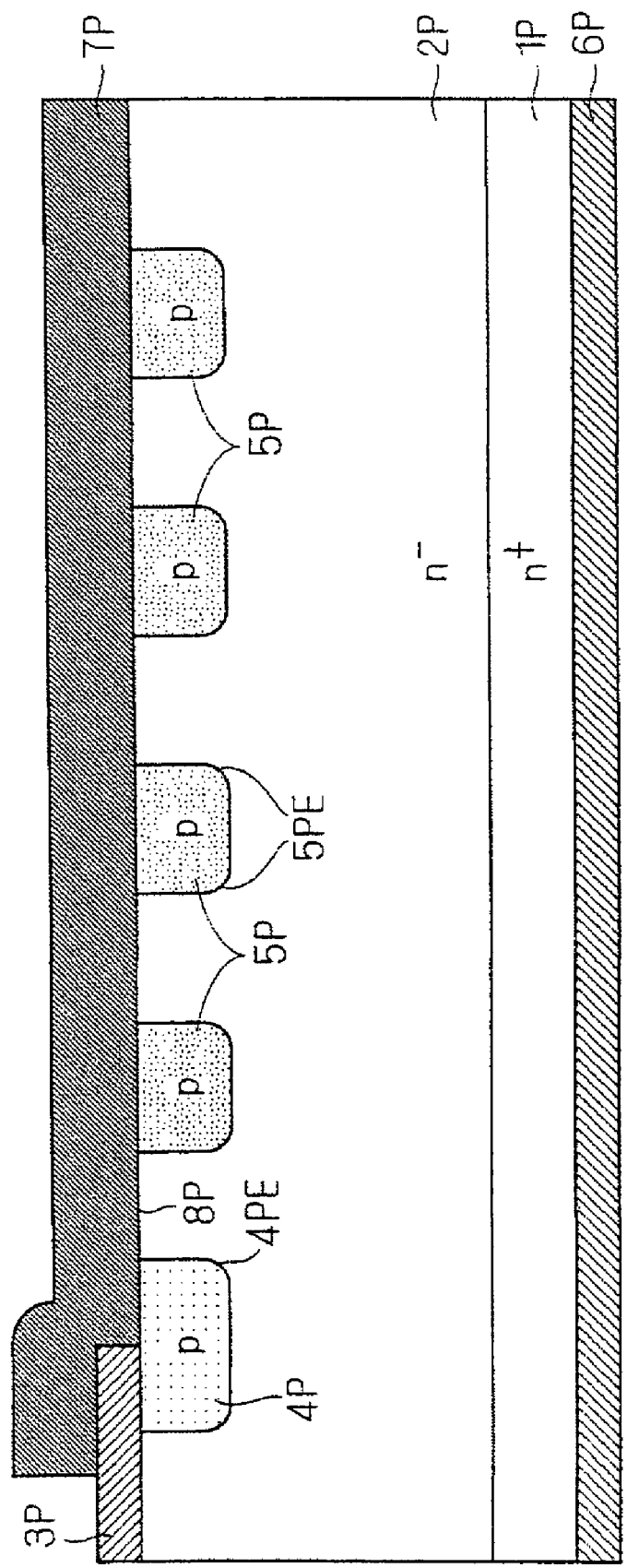
FIG. 9 is a vertical cross-sectional view showing a semiconductor device according to a conventional technology.

In the structure of a conventional JTE 5P that is shown in FIG. 9, the electric field is concentrated on an end portion (corner portion) 5PE of each JTE layer 5P that is generated during application of a reverse voltage, and due to its influence, the electric field is also generated at an interface 8P between a main surface of an n⁻ type semiconductor layer 2P and an insulating film 7P.

In contrast, the JTE layer 5 is formed in the portion directly below the groove 9 in the present embodiment, and hence a distance between the electric field concentrated portion (corner portion) 5E at the end portion of the JTE layer 5 and the main surface 2S of the n⁻ type semiconductor 2 is set to be longer compared with the case of FIG. 9. With this characteristic structure, the electric field strength applied on the main surface 2S of the n⁻ type semiconductor layer 2 during application of a reverse voltage can be made smaller compared with the case of FIG. 9. As a result, even when a defect, an interface energy level, and a minute amount of impurities that infiltrate into the interface 8 through the insulating film 7 exist at the interface 8 between the main surface 2S of the n⁻ type layer 2 and the insulating film 7, the defect and the like described above do not become the source and the breakdown point of the leakage current because the electric field strength on the main surface 2S of the n⁻ type semiconductor layer 2 is much smaller. Therefore, it is possible to achieve a semiconductor device having an ideal breakdown voltage in which deterioration of the breakdown voltage is suppressed.

In the present embodiment, the grooves 9 are provided, and thus a thickness 10 of the insulating film 7 on the bottom 9B of the groove 9 is set to be larger than a thickness 11 of the insulating film 7 on the main surface 2S of the n⁻ type semiconductor layer 2 in which the groove 9 is not formed. With this structure, it is possible to set a distance between the bottom 9B of the groove 9 in which the JTE layer 5 is formed and a surface 7S of the insulating film 7 to be longer than a distance between the main surface 2S of the n⁻ type semiconductor layer 2 and the surface 7S of the insulating film 7. For this reason, it is hard for impurities that infiltrate from the outside through the insulating film 7 to reach the JTE layer 5 positioned directly below the bottom 9B of the groove 9, and an interface 8J between the JTE layer 5 and the insulating film 7 is resistant to contamination by external impurities. As a result, it is possible to provide a semiconductor device having high reliability that is less deteriorated after the use for a long period of time.

Further, to put the effect of the present embodiment in another way, it is possible to reduce the electric field strength at the corner portion 5E of the end portion of the JTE layer 5 that is generated due to a surface electric charge occurring on the main surface 2S of the n⁻ type semiconductor layer 2.

So-called turnover phenomenon, in which breakdown voltage deteriorates significantly after breakdown occurs in a semiconductor device at an ideal breakdown voltage, occurs resulting from a change in distribution of an electric field strength of the GR 4 or JTE layer 5 that is a p type semiconductor layer, due to a change in charged state of the main surface 2S of the n⁻ type semiconductor layer 2 that is caused as a result of breakdown. However, in the present embodiment, even when the charged state of the main surface 2S of the n⁻ type semiconductor layer 2 changes, fluctuations in distribution of electric field strength at the end portion of the JTE layer 5 can be suppressed because the main surface 2S of the n⁻ type semiconductor layer 2 and the bottom 5B of the JTE layer 5 are more apart from each other compared with the case of FIG. 9. Accordingly, in the present embodiment, the turnover phenomenon does not occur even when breakdown occurs. Therefore, it is possible to provide a highly-reliable semiconductor device that can be used repeatedly.

In this case, as a depth T of the groove 9 in which the JTE layer 5 is formed becomes larger, the electric field strength decreases, which is caused on the main surface 2S of the n⁻ type semiconductor layer 2 due to an influence of the portion in which the electric field concentration occurs at the end portions of the GR layer 4 and the JTE layer 5. However, when the depth T of the groove 9 becomes excessively large, the intended effect becomes smaller that the JTE layer 5 mitigates electric field concentration of the GR layer 4. For this reason, it is desired that the depth T of the groove portion 9 at which the field effect mitigation effect is remarkably exerted be roughly in a range from a third to twice of the thickness of the GR layer 4.

Figure 3:
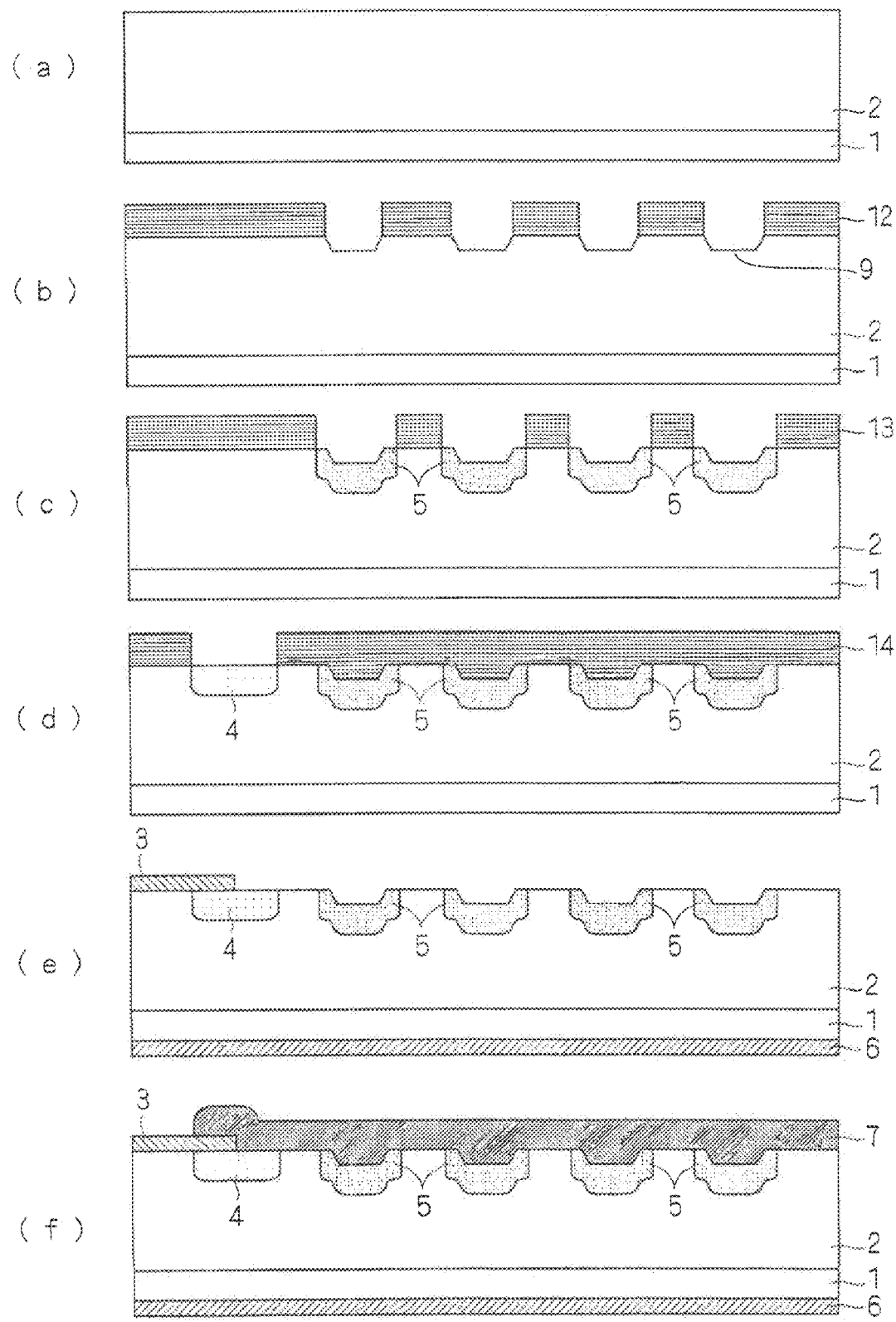
FIG. 3 is a vertical cross-sectional view showing the steps of manufacturing the semiconductor device according to the first embodiment of the present invention.

Next, a method of manufacturing the semiconductor device shown in FIG. 2 is described with reference to FIG. 3 showing cross sections of the semiconductor device during the manufacturing process. Note that description is given here of a method of manufacturing a Schottky barrier diode using 4H—SiC (silicon carbide) for the n⁺ type semiconductor substrate 1.

First, in the first step, there is prepared a substrate in which the n⁻ type semiconductor layer 2 is formed on the n⁺ type semiconductor substrate 1 (see part (a) of FIG. 3). For example, the n⁺ type semiconductor substrate 1 is a 4H—SiC (silicon carbide) substrate whose resistivity is 0.02 Ω·cm. As the n⁻ type semiconductor layer 2, one that has an n type impurity concentration of $5 \times 10^{15}$ cm⁻³ and a thickness set to 10 μm. The impurity concentration and thickness of the n⁻ type semiconductor layer 2 differ depending on a designed breakdown voltage of a semiconductor device.

In the following second step, a mask 12 formed on the main surface 2S of the n⁻ type semiconductor layer 2 is patterned, and ring-shaped openings are formed in the mask 12. Then, dry etching is performed, to thereby form a plurality of ring-shaped grooves 9 corresponding to the openings (see part (b) of FIG. 3). For example, a depth of the groove 9 is 0.3 μm.

In the following third step, the mask 12 is removed, and a new mask 13 formed on the main surface of the n⁻ type semiconductor layer 2 is patterned. Then, p type impurities are implanted thereinto, to thereby form, in portions directly below the bottoms 9B and the lateral surfaces 9S of the respective grooves 9, a plurality of JTE layers 5 corresponding thereto (see part (c) of FIG. 3). For example, a dose amount was set to $5 \times 10^{12}$ cm⁻², an acceleration voltage was divided into multiple stages of 40 to 700 keV, and then aluminum was implanted as p type impurities. The JTE layer 5 is formed, which has a box-shaped profile in which a thickness of a portion directly below the bottom 9B of the groove 9 is 0.8 μm and a concentration is $2 \times 10^{17}$ cm$^{-3}$. The portion in which the electric field is concentrated is generated in a region directly below the bottom 9B of the groove 9, and thus a breakdown voltage is secured when the implantation concentration in the region directly below the bottom 9B of the groove 9 satisfies the set value. Accordingly, the implantation concentration of p type impurities may differ between the region directly below the bottom 9B of the groove 9 and the region directly below the lateral surface 9S of the groove 9.

In the following fourth step, the mask 13 is removed, and a new mask 14 is patterned to make a ring-shaped opening at a position apart from the JTE layers 5, and then p type impurities are implanted there into, to thereby form the ring-shaped GR layer 4 from the main surface 2S of the n⁻ type semiconductor layer 2 toward the inside of the n⁻ type semiconductor layer 2 (see part (d) of FIG. 3). For example, a dose amount was set to $1.25 \times 10^{13}$ cm$^{-2}$, an acceleration voltage was divided into multiple stages of 10 to 700 keV, and then aluminum was implanted as p type impurities. The GR layer 4 is formed, which has a box-shaped profile in which a thickness is 0.8 μm and a concentration is $5 \times 10^{17}$ cm$^{-3}$. The impurity concentration of the GR layer 4 is higher than the impurity concentration of the JTE layer 5.

In the following fifth step, the mask 14 is removed, and then activation annealing of the impurities implanted into the GR layer 4 and the JTE layers 5 is performed. For example, activation annealing was performed at 1,700° C. for ten minutes. The process view is not shown.

In the following sixth step, the second electrode 6 formed of nickel that functions as an Ohmic electrode is formed on the rear surface of the n⁻ type semiconductor substrate 1. After that, the first electrode 3 formed of titanium or nickel that functions as a Schottky electrode is formed on part of the main surface 2S of the n⁻ type semiconductor layer 2 and the GR layer 4 (see part (e) of FIG. 3). The end portion 3E of the outer periphery portion of the first electrode 3 is in contact with the GR layer 4.

In the following seventh step, the insulating film 7 is formed on the end portion 3E of the outer periphery portion of the first electrode 3, the surface of the GR layer 4, the surfaces of the JTE layers 5 and the main surface 2S of the n– type semiconductor layer 2 (see part (f) of FIG. 3).

Through the above-mentioned steps, the semiconductor device shown in FIG. 2 is completed.

The effect of suppressing deterioration of breakdown voltage becomes higher as the number of JTE layers 5 increases. In Example, the effect was sufficiently exerted in a case of three or four JTE layers 5. Note that even when the number of JTE layers 5 is increased more than that, an actual effect hardly changed from that in the case of three or four JTE layers 5.

For example, a width W5 of each JTE layer 5 was set to 5 μm, and an interval between an end of the JTE layer 5 to an end of the next JTE layer 5 was set to 3 μm. In addition, a width W4 of the GR layer 4 was set to 10 μm, and an interval between an end of the GR layer 4 and an end of the JTE layer 5A adjacent thereto was set to 2 μm.

In the semiconductor device according to the present embodiment, while the p type semiconductor layers of the GR layer 4 and the JTE layer 5 both contain p type impurities, and as an example, the impurity concentration of the GR layer 4 is set to he larger than the impurity concentration of the JTE layer 5, the impurity concentrations of the GR layer 4 and the JTE layer 5 may he equal to each other.

First Modification

Figure 4:
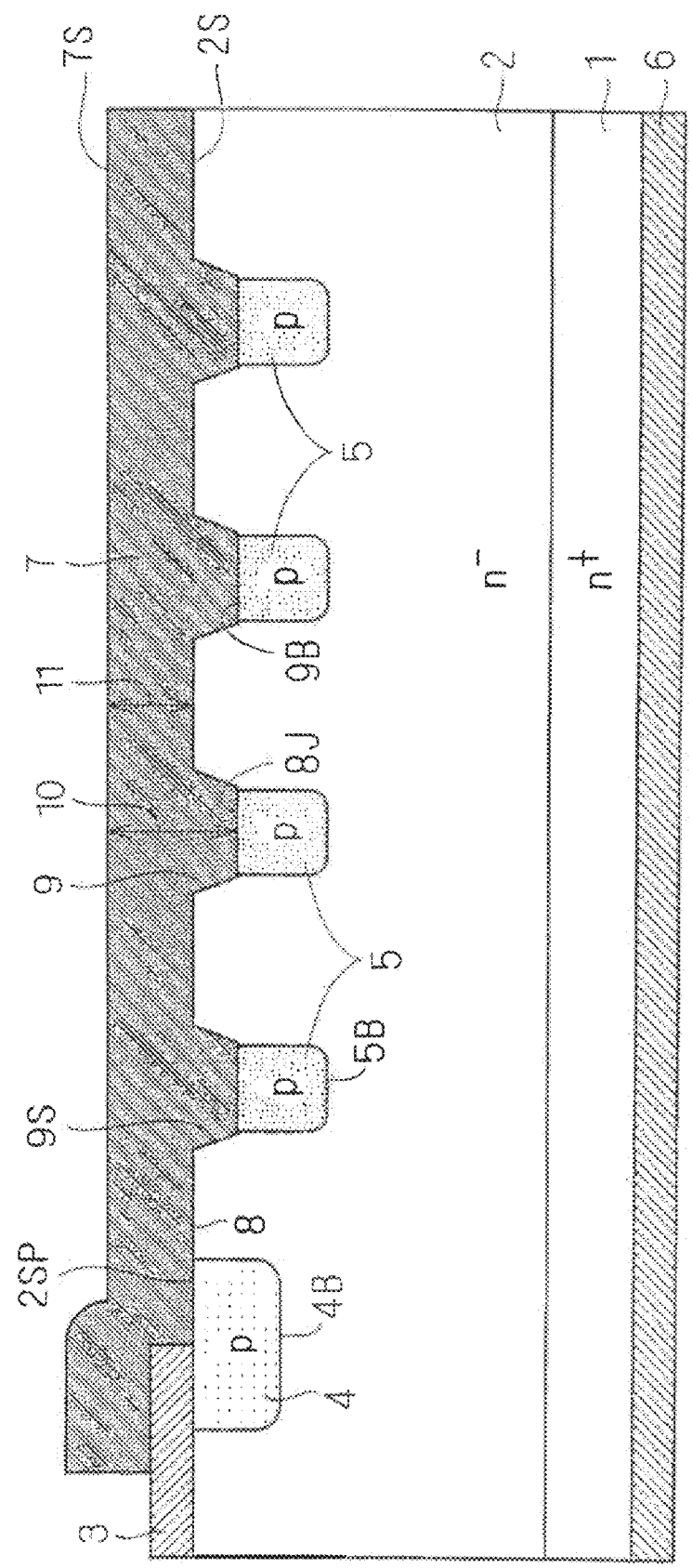
FIG. 4 is a vertical cross-sectional view showing a semiconductor device according to a first modification of the first embodiment of the present invention.

FIG. 4 is a vertical cross-sectional view showing a configuration of a semiconductor device according to a first modification of the first embodiment (FIG. 2). The semiconductor device shown in FIG. 4 is different from the semiconductor device shown in FIG. 2 only in that the JTE layer is not formed in the portion directly below the lateral surface 9S of each groove 9 but the JTE layer 5 is formed from the bottom 9B of each groove 9 toward an inside of the n⁻ type semiconductor layer 2. The other structure is similar to the corresponding structure shown in FIG. 2, and detailed description of other reference symbols are omitted.

Also in the present modification, as in the first embodiment, the distance between the electric field concentration portion (corner portion) of each JTE layer 5 and the surface 2S of the n⁻ type semiconductor layer 2 in which the grooves 9 are not formed is larger than that of the structure of the conventional example shown in FIG. 9. Accordingly, it is possible to reduce the electric field strength on the surface 2S of the n⁻ type semiconductor layer 2 compared with that of the conventional example of FIG. 9.

Second Modification

FIG. 5 is a vertical cross-sectional view showing a configuration of a semiconductor device according to a second modification of the first embodiment (FIG. 2). The semiconductor device shown in FIG. 5 is different from the semiconductor device shown in FIG. 2 only in that a depth TP, from the surface 2S of the n⁻ type semiconductor layer 2, of a bottom of a groove 9P among a plurality of grooves 9 that is positioned at the farthest position from or on the outermost side from the GR layer 4 is the largest among the depths T of the bottoms of the other grooves 9a, 9b and 9c (TP>T). Note that other structure is the same as the corresponding structure of the semiconductor device of FIG. 2, and thus the above-mentioned effect produced in the first embodiment is obtained similarly in the present embodiment.

In the respective JTE layers 5, thicknesses from the bottom of the corresponding groove 9 to the bottoms 5B and 5BP of the respective JTE layers are set to be the same as in the first embodiment. Therefore, with the structure according to the present embodiment, the bottom 5BP of the JTE layer 5P formed in the portion directly below the bottom and the lateral surface of the farthest groove 9P is positioned at the deepest position among the bottom 4B of the GR layer 4 and the bottoms 5B of the other JTE layers 5. Accordingly, compared with the other JTE layers 5, in the JTE layer 5P, the electric field concentration portion (corner portion) of this layer 5P is apart from the surface 2S of the n⁻ type semiconductor layer 2 most. Therefore, compared with the first embodiment, the electric field strength on the surface 2S of the n⁻ type semiconductor layer 2 in the vicinity of the groove 9P at the outermost peripheral portion, which is the most susceptible to the influence of the external impurities, can be reduced further.

Note that as a further modification of the present modification, the depths of the bottoms of the grooves 9a, 9b and 9c may be set such that the depth of the groove 9 directly below which the JTE layer 5 is formed increases from the groove 9 located at a position close to the GR layer 4 toward the groove 9 located at a position far away from the GR layer 4. That is, the depths of the bottoms of the grooves 9a, 9b, 9c and 9P shown in FIG. 5 are modified so as to satisfy the relationship (depth of the bottom of the groove 9a)<(depth of the bottom of the groove 9b)<(depth of the bottom of the groove 9c)< (depth of the bottom of the groove 9P). In the further modification as described above, the electric field concentration portion (corner portion) of each JTE layer 5 is apart from the surface 2S of the n⁻ type semiconductor layer 2 such that the JTE layer 5 is positioned farther from the GR layer 4. As a result, there is obtained an effect that the electric field strength on the surface 2S of the n⁻ type semiconductor layer 2 decreases as the position of the surface 2S becomes apart from a surface 2SP of the GR layer 4. Note that as to the manufacturing method, the groove 9 having a deeper bottom can be formed by further repeating the second step described above.

Third Modification

FIG. 6 is a vertical cross-sectional view showing a configuration of a semiconductor device according to a third modification of the first embodiment (FIG. 2). The semiconductor device shown in FIG. 6 is different from the semiconductor device shown in FIG. 2 only in that one JTE layer 5 is formed so that each of all grooves 9 is connected to one JTE layer 5. That is, in the structure of FIG. 6, part of the JTE layer 5 is formed also from a surface 2SA of the n⁻ type semiconductor layer 2 that is positioned between the neighboring grooves 9 toward the inside of the n⁻ type semiconductor layer 2, and the above-mentioned part of the JTE layer 5 is coupled to the other parts of the JTE layer 5 that is formed from the portion directly below the bottoms and lateral surfaces of the neighboring grooves 9, to thereby form one JTE layer 5 shown in FIG. 6. The other structure is similar to the corresponding structure in the first embodiment, and thus the above-mentioned effect of the first embodiment can be exerted in a similar manner.

According to the present modification, in particular, the JTE layer 5 that is a p type semiconductor layer is formed directly below the surface 2SA of the n⁻ type semiconductor layer 2 that is positioned between the neighboring grooves 9. Accordingly, there is obtained another effect that a capacitance of the JTE layer 5 can be adjusted.

Further, the JTE structure described in the first embodiment is also applicable to the semiconductor device having a GR layer structure different from the structure of the GR layer 4 according to the first embodiment. The modification as described above is described as fourth and fifth modifications hereinbelow. Needless to say, the effect described in the first embodiment is obtained in the fourth and fifth modifications as well.

Fourth Modification

Figure 7:
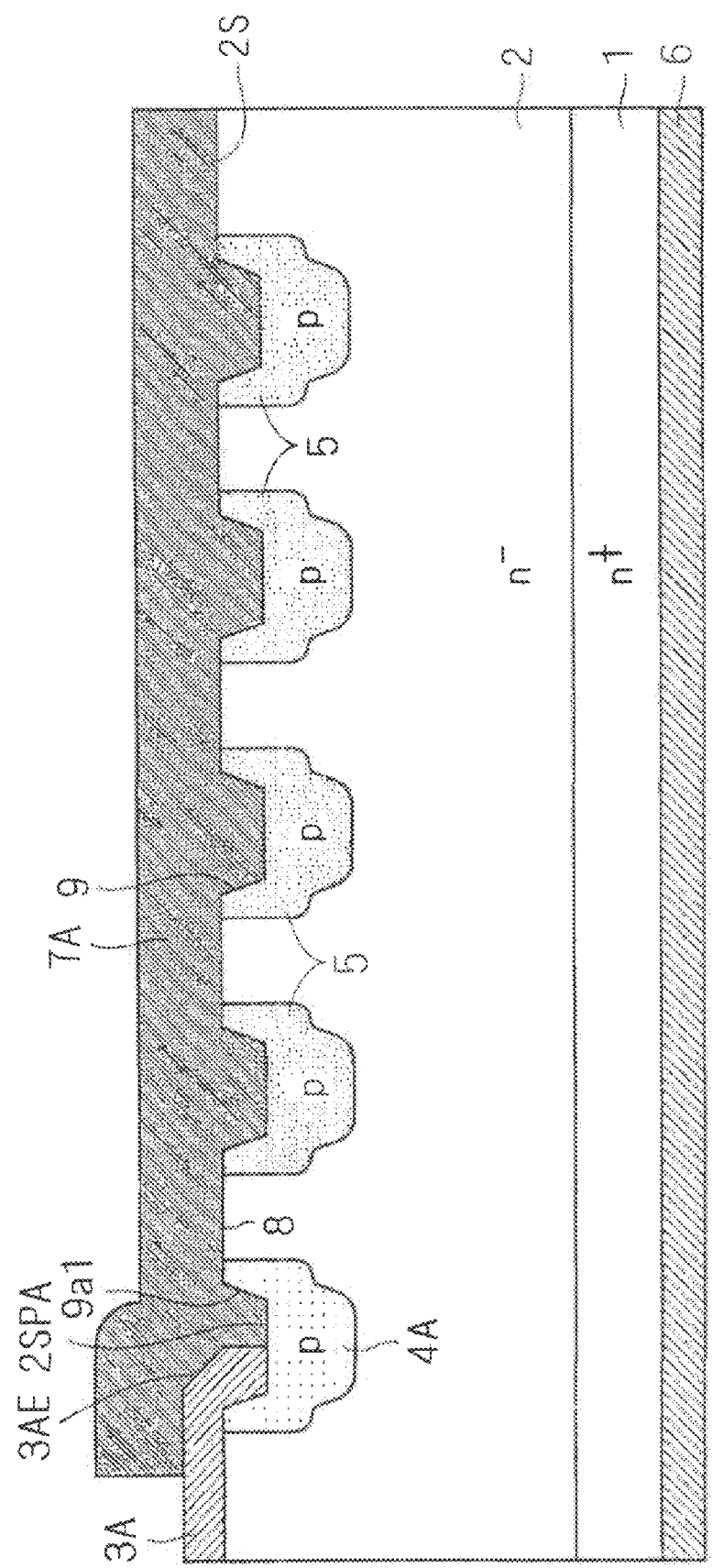
FIG. 7 is a vertical cross-sectional view showing a semiconductor device according to a fourth modification of the first embodiment of the present invention.

FIG. 7 is a vertical cross-sectional view showing a configuration of a semiconductor device according to a fourth modification of the first embodiment (FIG. 2). The semiconductor device shown in FIG. 7 is different from the semiconductor device shown in FIG. 2 in the characteristic that an end portion 3AE of a first electrode 3A and an end perimeter portion 2SPA thereof are disposed in a guard ring groove 9a1 where a p type GR layer 4A is formed directly therehelow. With this structure, part of an insulating film 7A is extended to an inside of the groove 9a1 to entirely cover the end perimeter portion 2SPA. The other structure is the same as the corresponding structure of the first embodiment.

According to the present modification, a distance between the electric field concentration portion (corner portion) of the GR layer 4A and the surface 2S of the n⁻ type semiconductor layer 2 is larger compared with the case of FIG. 2, and further, it is possible to increase a thickness of a portion of the insulating film 7A directly above the GR layer 4A. Accordingly, the electric field strength on the surface 2S of the n⁻ type semiconductor layer 2 around the GR layer 4A can be reduced, and at the same time, it is possible to suppress breakdown voltage deterioration due to an energy level and a defect on the surface 2S of the n⁻ type semiconductor layer 2 around the GR layer 4A.

Fifth Modification

Figure 8:
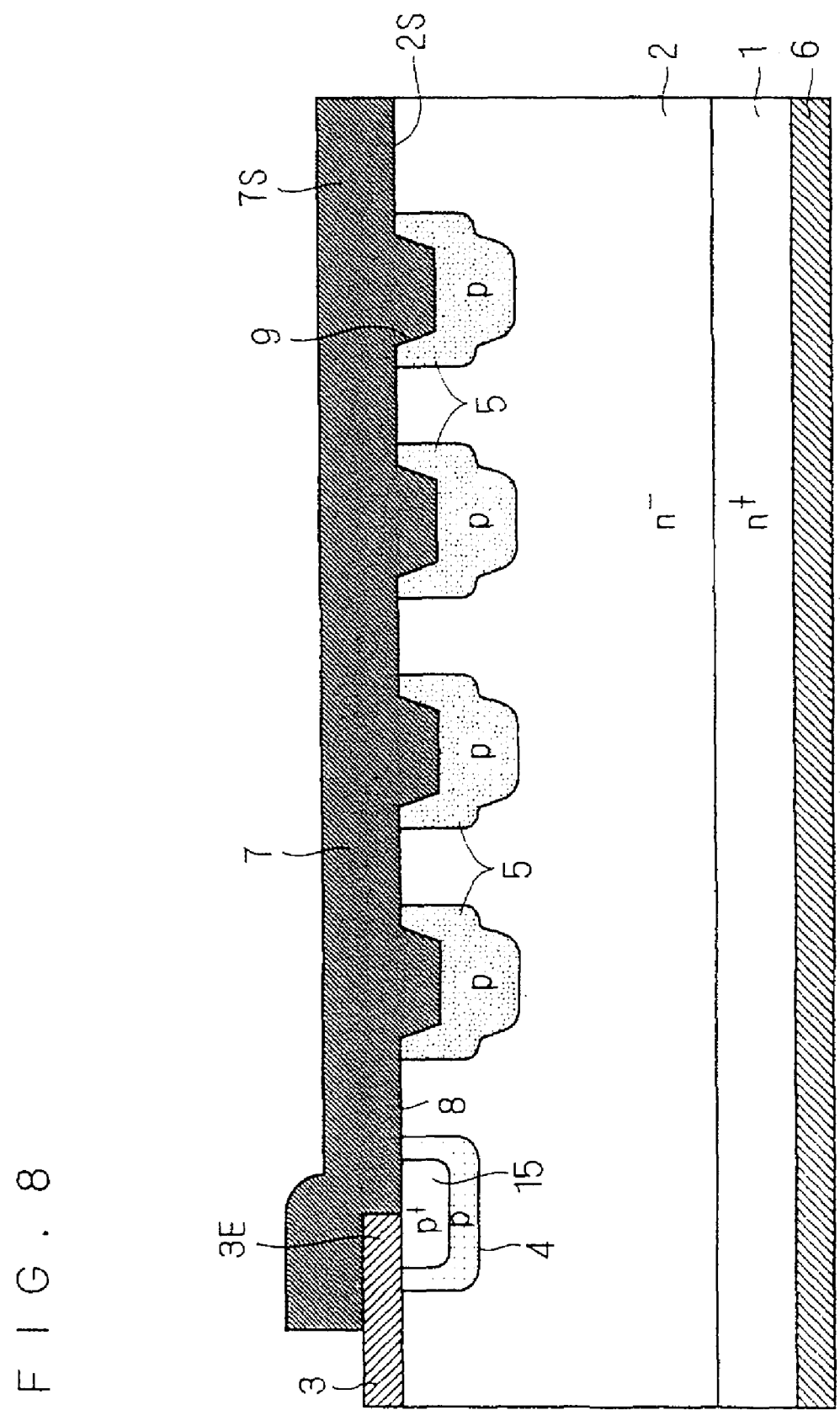
FIG. 8 is a vertical cross-sectional view showing a semiconductor device according to a fifth modification of the first embodiment of the present invention.

FIG. 8 is a vertical cross-sectional view showing a configuration of a semiconductor device according to a fifth modification of the first embodiment (FIG. 2). The semiconductor device shown in FIG. 8 is different from the semiconductor device shown in FIG. 2 only in that there is arranged, in the GR layer 4, a third p type semiconductor layer (corresponding to the second GR layer) that is in contact with the end portion 3E of the first electrode 3 and surrounds the first electrode 3 in a ring shape. An impurity concentration of the third p type semiconductor layer 15 is set to be higher than the impurity concentration of the GR layer 4. The other structure is similar to the corresponding structure shown in FIG. 2. The third p type semiconductor layer 15 has a function of mitigating electric field concentration in the corner of the end portion 3E of the first electrode 3.

Additional Notes

Note that the termination structure according to the subject matter of the present invention is also applicable to other power semiconductor devices such as a power MOSFET, in addition to the Schottky diodes described in the first embodiment and the respective modifications thereof.

Further, as to a conductivity type of impurities in the present invention, in a case where the n type is defined as the first conductivity type, the p type is the second conductivity type. In contrast, in a case where the p type is defined as the first conductivity type, the n type is the second conductivity type.

While the invention has been shown and described in detail, the foregoing description is in all aspects illustrative, and the present invention is not limited thereto. That is, numerous modifications and variations can be devised in the described aspects without departing from the scope of the invention.

The invention claimed is:

1. A semiconductor device, comprising:
   a semiconductor layer of a first conductivity type;
   an electrode formed on a main surface of said semiconductor layer;
   a guard ring layer of a second conductivity type formed from a part of said main surface of said semiconductor layer directly below an end portion of said electrode and extending toward an inside of said semiconductor layer so as to surround said electrode;
   at least one groove formed from a part of said main surface of said semiconductor layer located at a distance outside said end portion of said electrode and extending toward the inside of said semiconductor layer so as to surround, without touching, said guard ring layer;
   at least one junction termination extension (JTE) layer of said second conductivity type formed from a bottom of said at least one groove and extending toward an interior of said semiconductor layer so as to surround, without touching, said guard ring layer; and
   an insulating film formed on said main surface of said semiconductor layer so as to cover a surface of said guard ring layer and a surface of said at least one JTE layer.

2. The semiconductor device according to claim 1, wherein a bottom of said at least one JTE layer is located at a deeper position than a bottom of said guard ring layer.

3. The semiconductor device according to claim 1, wherein said at least one JTE layer is further formed on a lateral surface of said at least one groove and extending toward the interior of said semiconductor layer.

4. The semiconductor device according to claim 1, wherein a first film thickness measured from said main surface to a portion on said bottom of said at least one groove in said insulating film is larger than a second film thickness measured from a portion on said main surface in said insulating film in which said at least one groove is not formed.

5. The semiconductor device according to claim 1, wherein:
said groove includes a plurality of grooves;
said JTE layer includes a plurality of JTE layers, each corresponding to a respective groove of the plurality of grooves; and
among said plurality of grooves, the groove located farthest from said guard ring layer has the largest depth as measured from said main surface.

6. The semiconductor device according to claim 3, wherein:
said groove includes a plurality of grooves; and
said at least one JTE layer is one JTE layer formed so as to be connected to each of said plurality of grooves.

7. The semiconductor device according to claim 4, wherein:
said groove includes a plurality of grooves; and
said at least one JTE layer is one JTE layer formed so as to be connected to each of said plurality of grooves.

8. The semiconductor device according to claim 1, wherein said end portion of said electrode is disposed in a guard ring groove in which said guard ring layer is formed directly therebelow.

9. The semiconductor device according to claim 1, wherein said guard ring layer includes a second guard ring layer formed from a part of said main surface of said semiconductor layer located directly below said end portion of said electrode and extending toward an inside of said guard ring layer so as to surround said electrode, and containing impurities of said second conductivity type having higher concentration than impurities of said guard ring layer.

* * * * *